United States Patent
Takagi

(10) Patent No.: US 7,279,994 B2
(45) Date of Patent: Oct. 9, 2007

(54) VARIABLE CAPACITANCE CIRCUIT HAVING ON/OFF SWITCH FOR VARIABLE CAPACITANCE FUNCTION, AND VOLTAGE CONTROLLED OSCILLATOR USING THE VARIABLE CAPACITANCE CIRCUIT

(75) Inventor: Kotaro Takagi, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 61 days.

(21) Appl. No.: 11/129,312

(22) Filed: May 16, 2005

(65) Prior Publication Data

US 2005/0258914 A1    Nov. 24, 2005

(30) Foreign Application Priority Data

May 19, 2004    (JP)    ............................. 2004-148696

(51) Int. Cl.
*H03L 7/09*      (2006.01)
*H03B 5/08*      (2006.01)
*H03B 5/18*      (2006.01)
*H03H 5/12*      (2006.01)

(52) U.S. Cl. ............................. 331/36 C; 331/117 FE; 331/167; 331/177 V; 331/179

(58) Field of Classification Search ............... 331/36 C, 331/177 V, 179, 117 R, 117 FE, 167
See application file for complete search history.

(56) References Cited

U.S. PATENT DOCUMENTS 5,739,730 A    4/1998    Rotzoll

| | | | |
|---|---|---|---|
| 6,445,257 B1 * | 9/2002 | Cox et al. | 331/117 R |
| 6,853,272 B1 * | 2/2005 | Hughes | 334/15 |
| 6,906,596 B2 * | 6/2005 | Kitamura et al. | 331/36 C |
| 6,995,626 B2 * | 2/2006 | Oehm et al. | 331/177 V |

FOREIGN PATENT DOCUMENTS

WO    WO 01/20785 A1    3/2001
WO    WO 03/075451 A1    9/2003

* cited by examiner

*Primary Examiner*—Robert Pascal
*Assistant Examiner*—James Goodley
(74) *Attorney, Agent, or Firm*—Oblon, Spivak, McClelland, Maier & Neustadt, P.C.

(57) ABSTRACT

A variable capacitance circuit capable of switching on and off a variable capacitance function, includes variable capacitance means formed such that variable capacitance elements whose capacitance values change according to a voltage value of a supplied capacitance control voltage are connected so as to be paired and a plurality pairs of variable capacitance elements are connected in parallel forming multiple stages; bias voltage generation means for generating bias voltages of different voltage values based on a constant voltage from a constant voltage source; and an on-off switch for the variable capacitance function, in which the variable capacitance function of the variable capacitance means is turned on by supplying the bias voltage to the variable capacitance element of each stage of the variable capacitance means and turned off by grounding the bias voltage of each voltage value.

4 Claims, 9 Drawing Sheets

VARIABLE CAPACITANCE CIRCUIT HAVING ON/OFF SWITCH FOR VARIABLE CAPACITANCE FUNCTION, AND VOLTAGE CONTROLLED OSCILLATOR USING THE VARIABLE CAPACITANCE CIRCUIT

CROSS REFRENCE TO RELATED APPLICATIONS

The present invention contains subject matter related to Japanese Patent Application JP2004-148696, filed in the Japanese Patent Office on May 19, 2004, the entire contents of which being incorporated herein by reference.

BACKGROUND OF THE INVENTION

1. Field of the Invention

The present invention relates to a variable capacitance circuit having an on/off switch for a variable capacitance function, suitably used for communication apparatuses, such as a mobile telephone, a PHS telephone, and a PDA device having a communication function, and to a voltage controlled oscillator using the variable capacitance circuit.

2. Description of the Related Art

Traditionally, in a mobile telephone, a desired frequency signal to be used when transmitting and receiving a data is generated by a PLL synthesizer. The PLL synthesizer includes a reference oscillator which generates a reference frequency signal, and a programmable counter which generates a comparison frequency signal by dividing an output frequency signal outputted from the PLL synthesizer i.e. a frequency signal outputted from a voltage controlled oscillator (VCO: Voltage Controlled Oscillator) by a predetermined frequency dividing ratio.

Further, the PLL synthesizer includes a phase comparator for comparing a phase of the reference frequency signal from the reference oscillator with a phase of the comparison frequency signal from the programmable counter, and outputting a control voltage according to this phase difference, and a voltage controlled oscillator for generating and outputting a frequency signal according to the control voltage from this phase comparator i.e., the frequency signal outputted from the PLL synthesizer.

Although a crystal oscillator with high stability is used as the reference oscillator, it is difficult to oscillate a high frequency signal only with this crystal oscillator. For this reason, this PLL synthesizer generates the comparison frequency signal of relatively low frequency by means of the programmable counter, carries out phase comparison of the comparison frequency signal with the reference frequency signal from the reference oscillator, and obtains a comparison output. The stable high frequency signal is generated by driving the VCO with this comparison output. Further, this PLL synthesizer outputs an output signal of a desired frequency by changing the frequency dividing ratio of the programmable counter.

FIG. 8 shows a capacitance element changeover circuit which is used for the VCO in such a PLL synthesizer and switches between a variable, capacitance element (varactor diode) CV1 for high bandwidth oscillation and a variable capacitance element CV2 for low bandwidth oscillation according to an oscillation frequency band.

If a band changeover control voltage for the high bandwidth oscillation is supplied from a terminal 201 at the time of the high bandwidth oscillation, this band changeover control voltage is supplied to an analog switch 203 through an inverter 202, and the analog switch 203 is turned off.

When the analog switch 203 is turned off, the control voltage for continuously varying frequency, which is supplied through a terminal 204, is supplied only to the variable capacitance element CV1 for the high bandwidth oscillation. Based on a capacitance value of the variable capacitance element CV1, which is variably controlled by this control voltage for continuously varying the frequency, the high frequency signal is oscillated from the VCO.

In addition, at the time of this high bandwidth oscillation, a constant voltage supply switch 205 is turned on by the band change over control voltage for the high bandwidth oscillation, and a constant voltage supplied to a power supply terminal 206 is supplied to the variable capacitance element CV2 for the low bandwidth oscillation instead of the control voltage for continuously varying frequency. With this constant voltage, the capacitance value of the variable capacitance element CV2 for the low bandwidth oscillation is held at a fixed capacitance value, and then the capacitance value of the variable capacitance element CV1 for the high bandwidth oscillation is variably controlled.

Next, at the time of the low bandwidth oscillation, when the band changeover control voltage for the low bandwidth oscillation is supplied from the terminal 201, this band changeover control voltage is supplied through the inverter 202 to the analog switch 203, and the analog switch 203 is turned on.

When the analog switch 203 is turned on, the control voltage for continuously varying frequency, which is supplied through the terminal 204, is supplied to the variable capacitance element CV1 for the high bandwidth oscillation and the variable capacitance element CV2 for the low bandwidth oscillation. Based on the capacitance value of the variable capacitance element CV1 and the capacitance value of the variable capacitance element CV2, which are variably controlled by the control voltage for continuously varying frequency, a low frequency signal is oscillated from the voltage controlled oscillator.

In addition, at the time of this low bandwidth oscillation, the constant voltage supply switch 205 is turned off by the band changeover control voltage for the high bandwidth oscillation, the control voltage for continuously varying frequency is supplied to the variable capacitance element CV2 for the low bandwidth oscillation instead of the constant voltage, and the capacitance value of the variable capacitance element CV2 for the low bandwidth oscillation is variably controlled by the control voltage for continuously varying frequency, as described above.

FIG. 9 shows an example of the voltage controlled oscillator. This voltage controlled oscillator generates a negative resistance component by means of CMOS transistors M1 to M4, and oscillates at a resonance frequency of a parallel resonance circuit constituted by an inductance element L1, an inductance element L2, a variable capacitance element CV (varactor for frequency control), and a band changeover switch Csw (band switch SW). The band changeover switch Csw is controlled according to the band changeover control voltage supplied to a terminal 208.

As for the capacitance value (fosc) of the variable capacitance element CV, its resonance frequency, i.e., the oscillation frequency of the voltage controlled oscillator changes within a range of the following expression, according to a direct current voltage applied to a terminal 207.

In addition, in the following expression, "CVmax" indicates the maximum capacitance value of the variable capacitance element CV, "CVmin" indicates the minimum capacitance value of the variable capacitance element CV, and "Csw" indicates the capacitance value of the band changeover switch.

$$fosc=1/(2\pi\times\sqrt{L(CV\max+Csw)})\sim 1/(2\pi\times\sqrt{L(CV\min+Csw)})$$

The band changeover switch Csw is a capacitance switch of a CMOS, as shown in FIG. 10. When obtaining a low bandwidth oscillation frequency, a band switch signal of a low-level voltage value (grounding potential) is supplied to the terminal 208, and when obtaining a high bandwidth oscillation frequency, a band switch signal of a high level voltage value (Vcc) is supplied to the terminal 208, so that the oscillation frequency of the voltage controlled oscillator is changed according to the high bandwidth and the low bandwidth.

In other words, when the band switch signal of the low-level voltage value is supplied, as for the band changeover switch Csw, its capacitance value becomes the maximum value, and an oscillation frequency (foscl) within the frequency range as shown in the following expression is obtained from the voltage controlled oscillator.

In addition, in the following expression, "CVmax" indicates the maximum capacitance value of the variable capacitance element CV, "CVmin" indicates the minimum capacitance value of the variable capacitance element CV, and "Cswh" indicates the capacitance value when the band switch signal of the low-level voltage value is supplied to the band changeover switch, i.e., the maximum capacitance value.

$$foscl=1/(2\pi\times\sqrt{L(CV\max+Cswh)})\sim 1/(2\pi\times\sqrt{L(CV\min+Cswh)})$$

Similarly, when the band switch signal of the high-level voltage value is supplied, the capacitance value of the band changeover switch Csw becomes the minimum value, and an oscillation frequency (fosch) within the frequency range as expressed by the following expression is obtained from the voltage controlled oscillator.

In addition, in the following expression, "CVmax" indicates the maximum capacitance value of the variable capacitance element CV, "CVmin" indicates the minimum capacitance value of the variable capacitance element CV, and "Cswl" indicates the capacitance value when the band switch signal of the high-level voltage value is supplied to the band changeover switch, i.e., the minimum capacitance value.

$$fosch=1/(2\pi\times\sqrt{L(CV\max+Cswh)})\sim 1/(2\pi\times\sqrt{L(CV\min+Cswh)})$$

[Patent Document 1];

Japanese Patent Application Publication No. 2002-43842 (pp 3–4: FIG. 1)

SUMMARY OF THE INVENTION

However, the capacitance element changeover circuit as shown in FIG. 8 needs the analog switch 203 for controlling and switching connection/disconnection of the variable capacitance element CV2 with respect to a capacitance control terminal 200. Further, in order to hold the capacitance value of the variable capacitance element CV2 for the low bandwidth oscillation, at a steady value, which is not used at the time of the high bandwidth oscillation, a circuit for supplying a constant voltage to the variable capacitance element CV2 for the low bandwidth oscillation at the time of the high bandwidth oscillation, i.e., the constant voltage supply switch 205 etc., is needed.

Thus, a circuit structure becomes complicated because the analog switch 203, the constant voltage supply switch 205, etc., are needed.

Further, in the voltage controlled oscillator as shown in FIG. 9, an oscillation frequency change width at the time of the low bandwidth oscillation becomes narrower than an oscillation frequency change width at the time of the high bandwidth oscillation, since inclination of a variable curve of the oscillation frequency is uniquely determined by the oscillation frequency band.

FIG. 11 shows an equivalent circuit of the voltage controlled oscillator as shown in FIG. 9. In FIG. 11, "L1" is an on-chip inductor of the voltage controlled oscillator, "C1" shows variable capacitance of the variable capacitance element CV, "C2" shows capacitance of the band changeover switch Csw, and "C3" shows a sum of wiring capacitance in the chip of the voltage controlled oscillator and transistor gate capacitance. Further, the oscillation frequency (fosc) of the voltage controlled oscillator as shown in FIG. 11 becomes "$fosc=1/(2\pi\times\sqrt{L1(C1+C2+C3)})$".

Furthermore, when the variable capacitance C1 of the variable capacitance element CV and the capacitance C2 of the band changeover switch Csw are changed, the oscillation frequency change at the time of the high bandwidth oscillation becomes a solid line as shown in FIG. 12, and the oscillation frequency change at the time of the low bandwidth oscillation becomes a dotted and dashed line as shown in FIG. 12.

As can be seen from the expression of this output frequency (fosc) and FIG. 12, in this voltage controlled oscillator, since the inclination of the variable curve of oscillation frequency is uniquely determined by the oscillation frequency band, the amount of inclination of frequency change curve at the time of the low bandwidth oscillation becomes smaller than the amount of inclination of the frequency change curve at the time of the high bandwidth oscillation, and the oscillation frequency change width at the time of the low bandwidth oscillation becomes narrower than the oscillation frequency change width at the time of the high bandwidth oscillation.

Then, if the oscillation frequency change width at the time of the low bandwidth oscillation becomes narrow, frequency setting conditions and setting conditions of frequency change width at the time of the low bandwidth oscillation are restricted more than frequency setting conditions and the setting conditions of frequency change width at the time of the high bandwidth oscillation.

The present invention is invented in view of the above-mentioned circumstances, and provides a voltage controlled oscillator whose circuit structure can be simplified, and in which the frequency change width at the time of the low bandwidth oscillation is widened so as to give a degree of freedom to frequency setup and setup of frequency change width, and a variable capacitance circuit having an on/off switch for a variable capacitance function used for the voltage controlled oscillator.

As a means for addressing the above-mentioned circumstances, the present invention provides a variable capacitance circuit having an on/off switch for a variable capacitance function which includes: variable capacitance means formed such that variable capacitance elements whose capacitance values change according to a voltage value of a supplied capacitance control voltage are connected so as to be paired, and a plurality of pairs of variable capacitance elements are connected in parallel forming multiple stages;

and bias voltage generation means for generating bias voltages of different voltage values, based on a constant voltage from a constant voltage source.

Further, in addition to them, the circuit includes an on-off switch for the variable capacitance function, in which if the variable capacitance function of the variable capacitance means is controlled and turned on, the variable capacitance function of the variable capacitance means is turned on by supplying the bias voltage of each voltage value generated by the bias voltage generation means, to the variable capacitance element of each stage of the variable capacitance means, and if the variable capacitance function of the variable capacitance means is turned off, the variable capacitance function of the variable capacitance means is turned off by grounding the bias voltage of each voltage value generated by the bias voltage generation means, the bias voltage each being supplied to the variable capacitance element of each stage of the variable capacitance means.

Further, the voltage controlled oscillator in accordance with the present invention is a voltage controlled oscillator constructed such that a resonance circuit including an inductance element, variable capacitance means connected with the inductance element in parallel, and band changeover means for switching oscillation frequency bands is connected with a negative resistance circuit of a differential structure.

In other words, this voltage controlled oscillator includes first variable capacitance means having: a first variable capacitance circuit, which is provided as variable capacitance means of the resonance circuit and formed such that variable capacitance elements whose capacitance values change according to the voltage value of the supplied capacitance control voltage are connected so as to be paired, and a plurality of pairs of the variable capacitance elements are connected in parallel forming multiple stages; and a first bias voltage generation circuit configured to generate bias voltages of different voltage values, based on the constant voltage from the constant voltage source, so as to be supplied to each variable capacitance element of the first variable capacitance circuit.

Further, the voltage controlled oscillator includes second variable capacitance means having: a second variable capacitance circuit, which is provided as variable capacitance means of the resonance circuit and formed such that variable capacitance elements whose capacitance values change according to the voltage value of the supplied capacitance control voltage are connected so as to be paired, and a plurality of pairs of the variable capacitance elements are connected in parallel forming multiple stages; a second bias voltage generation circuit configured to generate bias voltages of different voltage values, based on the constant voltage from the constant voltage source; and an on-off switch for the variable capacitance function, in which if the variable capacitance function of the second variable capacitance circuit is turned on, the second variable capacitance function of the variable capacitance circuit is turned on by supplying the bias voltage of each voltage value generated by the second bias voltage generation circuit, to the variable capacitance element of each stage of the second variable capacitance circuit, and if the variable capacitance function of the second variable capacitance circuit is turned off, the second variable capacitance function of the variable capacitance circuit is turned off by grounding the bias voltage of each voltage value generated by the second bias voltage generation circuit, the bias voltage each being supplied to the variable capacitance element of each stage of the second variable capacitance circuit.

Further, in addition to them, the oscillator includes a band changeover switch, provided as the band change means, in which when the variable capacitance function of the second variable capacitance circuit is turned off, the oscillation frequency band is set as a high bandwidth by controlling the capacitance value to be the minimum value, and when the variable capacitance function of the second variable capacitance circuit is turned on, the oscillation frequency band is set as a low bandwidth, by controlling the capacitance value to be the maximum value.

The present invention can simplify the circuit structure. Thus, a wiring layout can easily be achieved in the case of integrating the circuit.

Further, the present invention can widen the frequency change width at the time of the low bandwidth oscillation, and can give a degree of freedom to the frequency setup and the setup of frequency change width.

DESCRIPTION OF THE EMBODIMENTS

The present invention can be applied to a dual-band voltage controlled oscillator in which an oscillation frequency can be switched between a high bandwidth oscillation frequency and a low bandwidth oscillation frequency.

[Structure of Voltage Controlled Oscillator]

Figure 1:
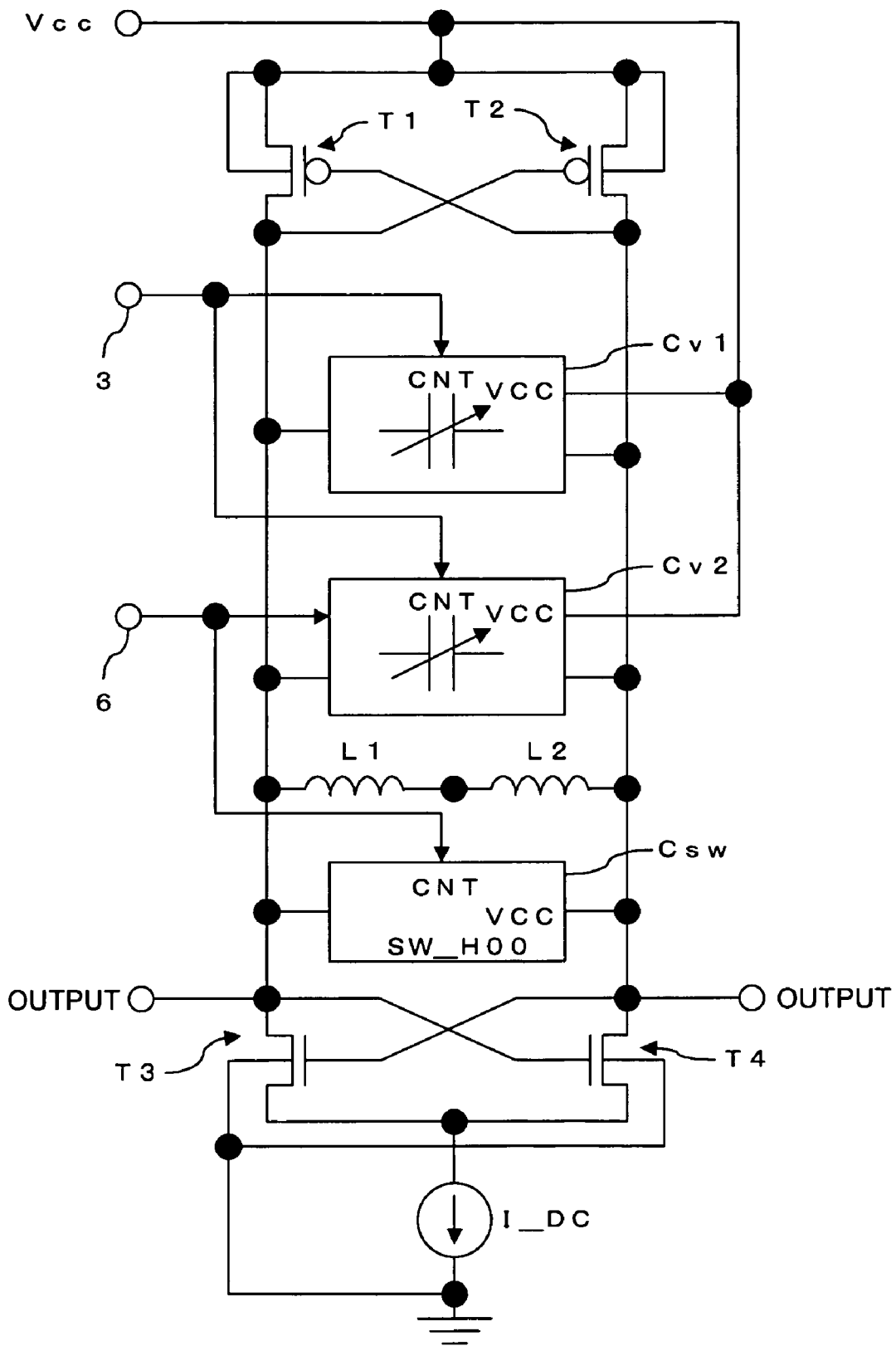
FIG. 1 is a circuit diagram showing a voltage controlled oscillator which is an embodiment in accordance with the present invention.

This voltage controlled oscillator is a differential voltage controlled oscillator, as shown in FIG. 1, and is arranged to oscillate at a resonance frequency of a parallel resonance circuit constituted by CMOS (Complementary Metal-Oxide Semiconductor) transistors T1 to T4 for generating a negative resistance component, inductance elements L1 and L2 which are connected in series, a first variable capacitance circuit CV1, a second variable capacitance circuit CV2 having an on-off function for a variable capacitance function, and a band changeover switch Csw (band switch SW) for switching oscillation frequencies according to the high bandwidth and the low bandwidth.

[Structure of First Variable Capacitance Circuit CV1]

Figure 2:
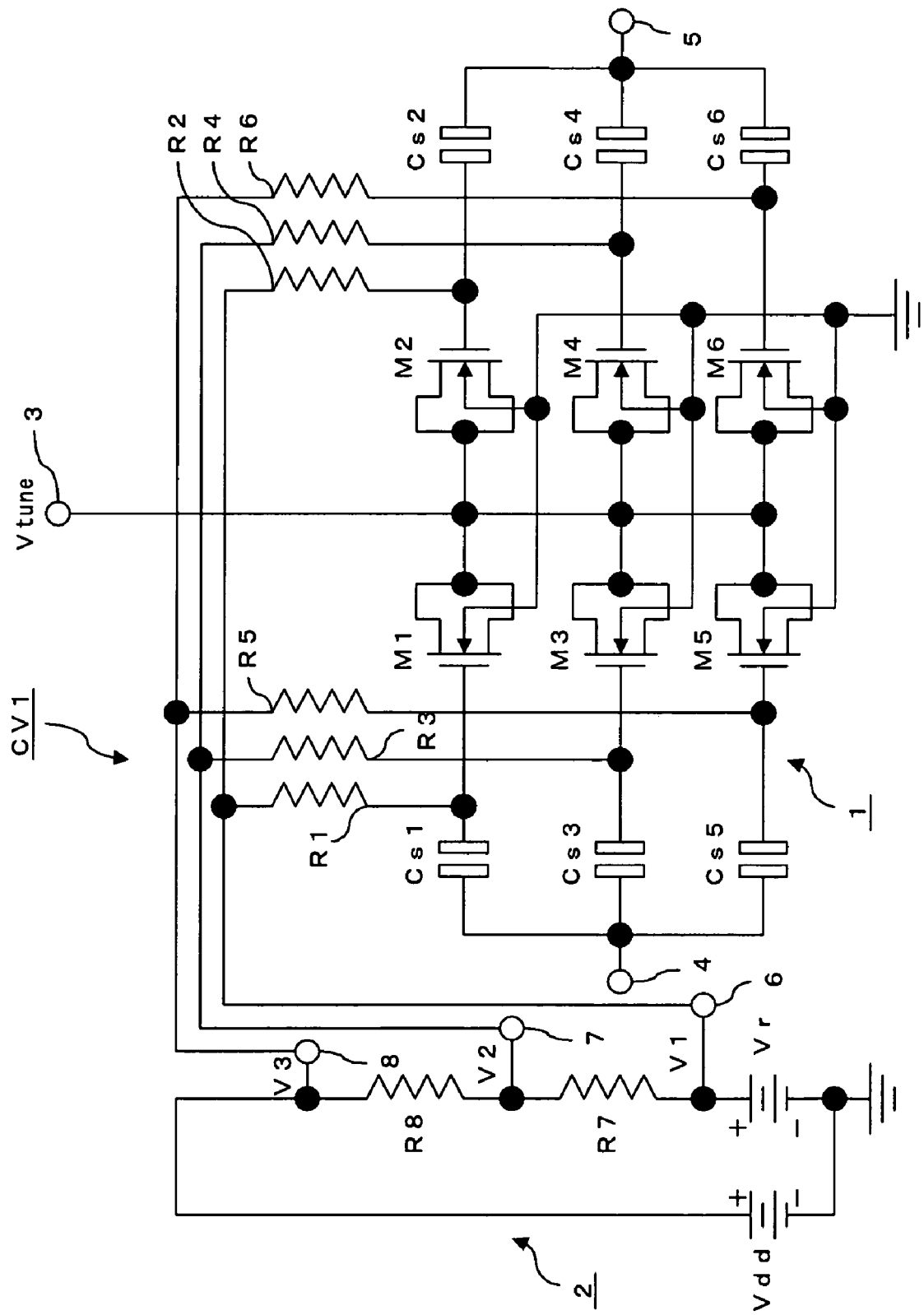
FIG. 2 is a circuit diagram showing a first variable capacitance circuit provided in the voltage controlled oscillator of the present embodiment.

The first variable capacitance circuit CV1 has a CMOS variable capacitance circuit 1, and a stepwise direct-current potential generation circuit 2, as shown in FIG. 2.

[Structure of CMOS Variable Capacitance Circuit 1]

The CMOS variable capacitance circuit 1 has a structure in which CMOS transistors M1 and M2, CMOS transistors M3 and M4, and CMOS transistors M5 and M6 which respectively constitute pairs are connected in parallel in three stages.

A drain and a source of each of the CMOS transistors M1 to M6 are connected together. A connection between the drain and the source of each of these CMOS transistors M1 to M6 is commonly connected to a control voltage terminal 3 through which a control voltage (Vtune) for continuously varying frequency is supplied.

Further, bases of the CMOS transistors M1, M2, M3, M4, M5, and M6 are respectively connected to series capacitances Cs1 to Cs6. Each of these series capacitances Cs1 to Cs6 is provided in order to cut a direct-current bias voltage of the voltage controlled oscillator, which is supplied through a terminal 4 or a terminal 5. Therefore, the direct-current bias voltage of the voltage controlled oscillator is not supplied to the base of each of the CMOS transistors M1, M3, and M5. In this first variable capacitance circuit CV1, the stepwise direct-current potential generation circuit 2 generates a first to a third bias voltages V1 to V3 which are stepwise bias voltages, apart from the direct-current bias voltage of the voltage controlled oscillator, and these voltages are supplied to the bases of the CMOS transistors M1 to M6. The first to the third bias voltages V1 to V3 will be described later.

In addition, capacitance values of the series capacitances Cs1 to Cs6 are adjusted so as not to affect a variable capacitance value Cv of the first variable capacitance circuit CV1 and so as to be sufficiently small in capacitance value with respect to the variable capacitance value Cv of the first variable capacitance circuit CV1.

Next, a connection point between the CMOS transistor M1 and the series capacitance Cs1, and a connection point between the CMOS transistor M2 and the series capacitance Cs2 are respectively connected via a resistor R1 or a resistor R2 to a first bias voltage supplied terminal 6 through which a first bias voltage V1 generated in the stepwise direct-current potential generation circuit 2 is supplied.

Similarly, a connection point between the CMOS transistor M3 and the series capacitance Cs3, and a connection point between the CMOS transistor M4 and the series capacitance Cs4 are respectively connected via a resistor R3 or a resistor R4 to a second bias voltage supplied terminal 7 through which the second bias voltage V2 generated in the stepwise direct-current potential generation circuit 2 is supplied.

Similarly, a connection point between the CMOS transistor M5 and the series capacitance Cs5, and a connection point between the CMOS transistor M6 and the series capacitance Cs6 are respectively connected via a resistor R5 or a resistor R6 to a third bias voltage supplied terminal 8 through which the third bias voltage V3 generated in the stepwise direct-current potential generation circuit 2 is supplied.

[Structure of Stepwise Direct-Current Potential Generation Circuit 2]

Instead of the bias voltages of the voltage controlled oscillator, which are cut by the series capacitances Cs1 to Cs6 as described above, the stepwise direct-current potential generation circuit 2 independently generates the bias voltages supplied to the base of each of the CMOS transistors M1 to M6.

In particular, this stepwise direct-current potential generation circuit 2 is constituted by resistors R7 and R8 which are connected in series, and constant voltage sources Vdd and Vr, and is arranged such that the first bias voltage V1 is taken out of a connection point between the constant voltage source Vr and the resistor R7, the second bias voltage V2 is taken out of a connection point between the resistor R7 and the resistor R8, and the third bias voltage V3 is taken out of a connection point between the resistor R8 and the constant voltage source Vdd, to thereby form the bias voltages different from one another in voltage value.

Then, the first bias voltage V1 generated without dividing a constant voltage of the constant voltage source is supplied, via the resistor R1, from the first bias voltage supplied terminal 6 to the base of the CMOS transistor M1, and also supplied to the base of the CMOS transistor M2 via the resistor R2. The second bias voltage generated by dividing the constant voltage of the constant voltage source by resistor R7 is supplied, via the resistor R3, from the second bias voltage supplied terminal 7 to the base of the CMOS transistor M3, and also supplied to the base of the CMOS transistor M4 through the resistor R4. The third bias voltage generated by dividing the constant voltage of the constant voltage source by the resistor R7 and the resistor R8 is supplied, via the resistor R5, from the third bias voltage supplied terminal 8 to the base of the CMOS transistor M5, and also supplied to the base of the CMOS transistor M6 through resistor R6.

[Structure of Second Variable Capacitance Circuit CV2]

Figure 3:
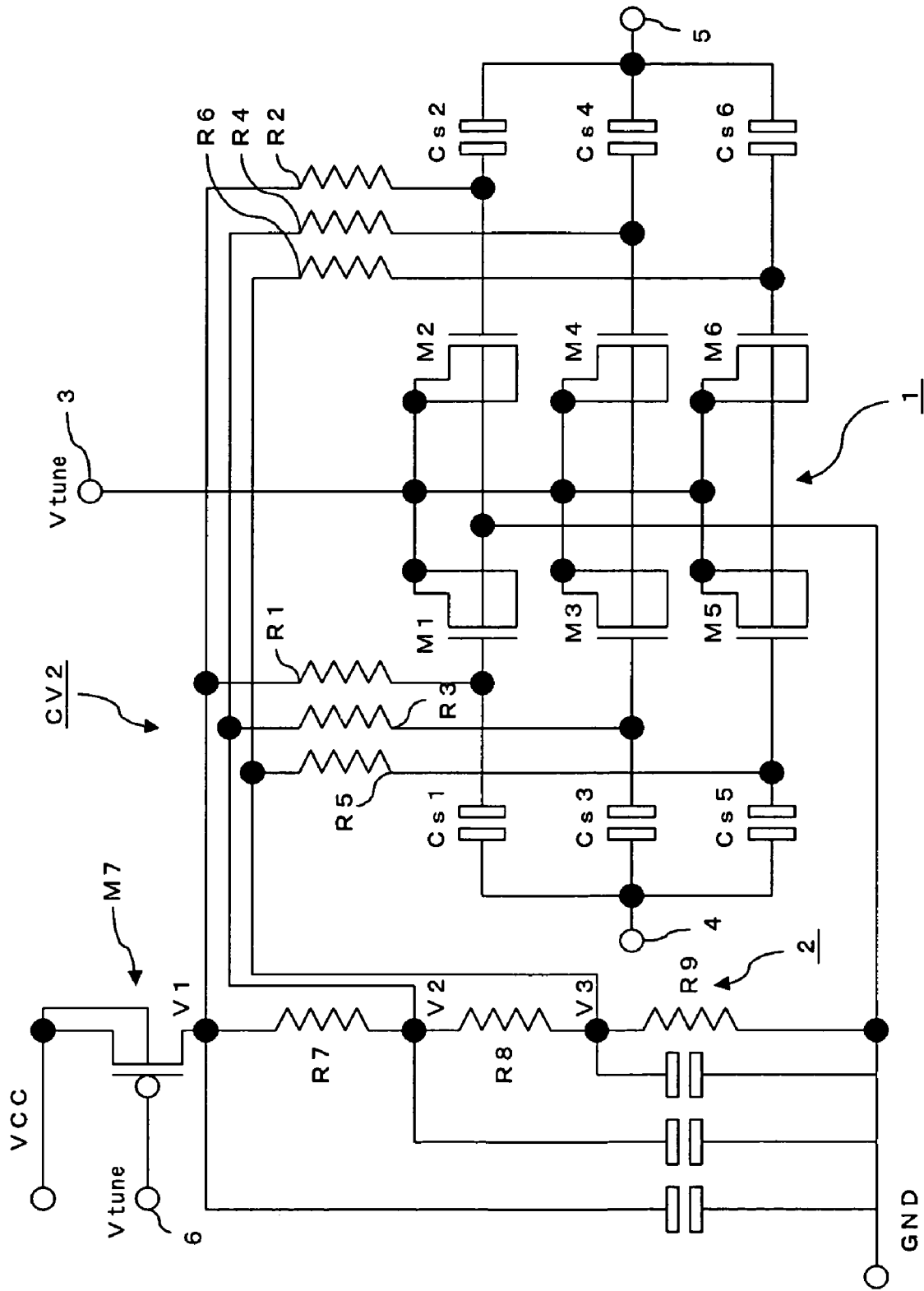
FIG. 3 is a circuit diagram showing a second variable capacitance circuit provided in the voltage controlled oscillator of the present embodiment.

Similar to the first variable capacitance circuit CV1, the second variable capacitance circuit CV2 has the CMOS variable capacitance circuit 1, and the stepwise direct-current potential generation circuit 2, as shown in FIG. 3. As well as these circuits 1 and 2, a P channel FET M7 is provided which carries out on-off control of the variable capacitance function of the second variable capacitance circuit CV2.

This P channel FET M7 is inserted between the constant voltage source (Vcc) and the resistor R7 of the stepwise direct-current potential generation circuit 2. The band changeover control voltage supplied to the band changeover switch Csw is reversed and supplied to a gate of the P channel FET M7 through the band-changeover control voltage terminal 6. The P channel FET M7 is driven and turned on/off by this band changeover control voltage, and the on-off control of the variable capacitance function of the CMOS variable capacitance circuit 1 is carried out.

[Structure of Band Changeover Switch Csw]

Figure 10:
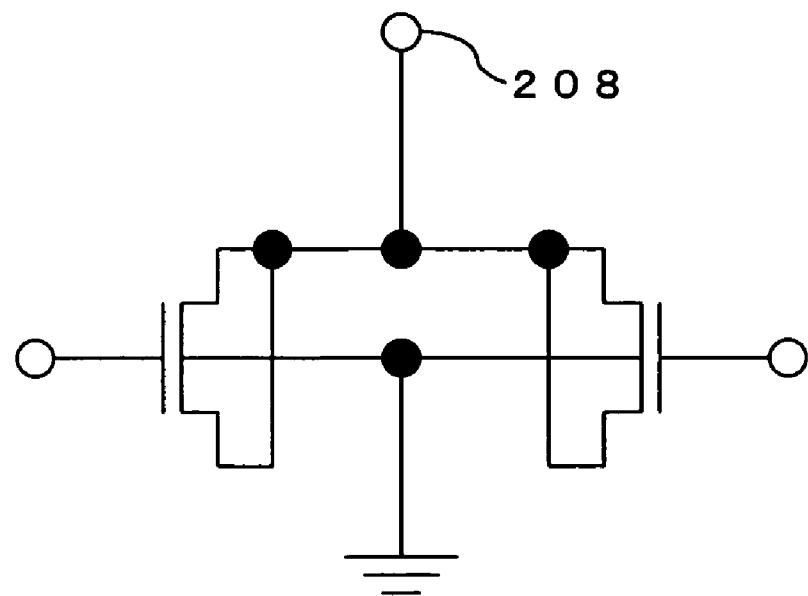
FIG. 10 is a circuit diagram showing a band changeover switch provided in another related art voltage controlled oscillator.
Figure 11:
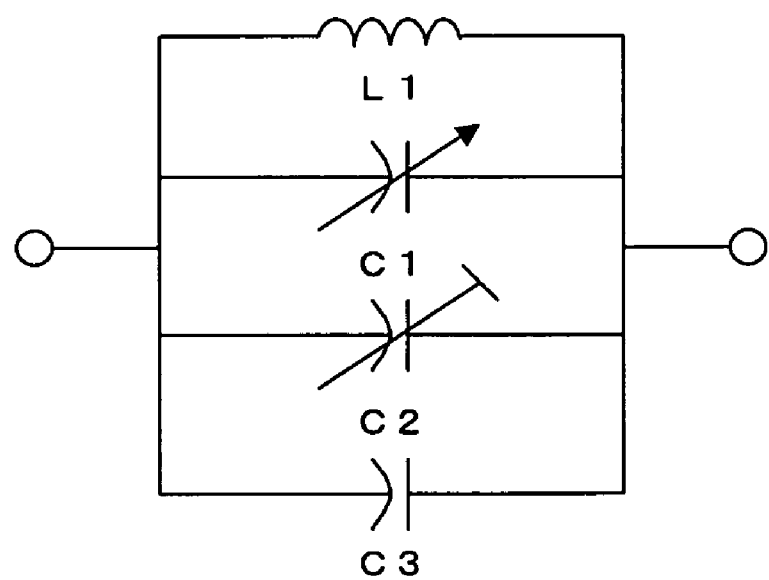
FIG. 11 is a diagram for explaining oscillation conditions of another related art voltage controlled oscillator.
Figure 12:
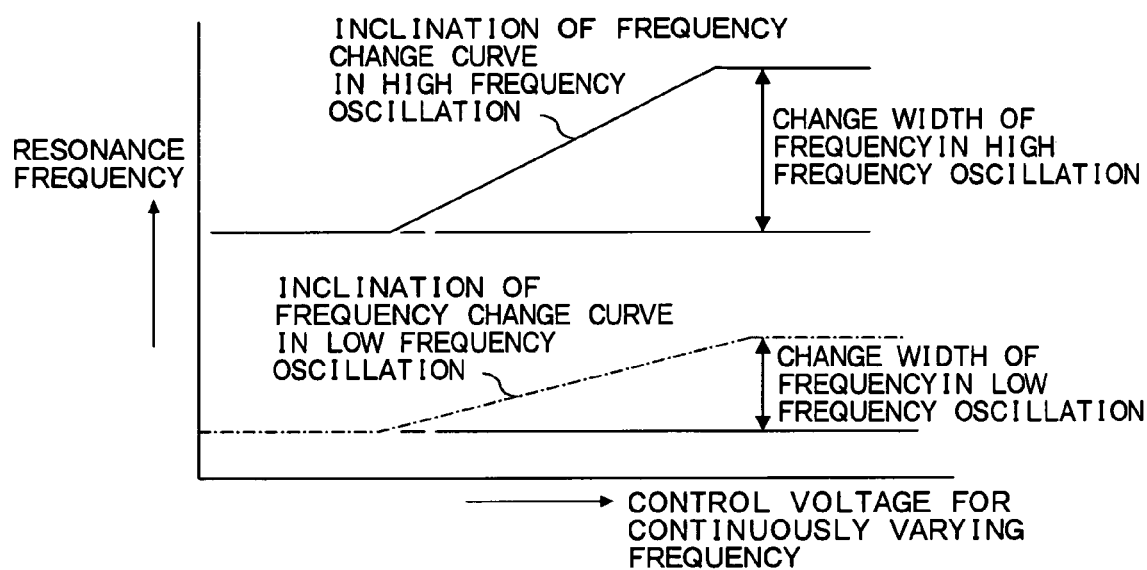
FIG. 12 is a graph showing a frequency change width at the time of the low bandwidth oscillation which is narrower than the frequency change width at the time of the high bandwidth oscillation, in another related art voltage controlled oscillator.

As shown in FIG. 10, the band changeover switch Csw is formed as a capacitance switch of CMOS. When obtaining the oscillation frequency of the low bandwidth, a band changeover voltage of a low level (grounding potential) is supplied, and when obtaining the oscillation frequency of the high bandwidth, the high-level band changeover voltage (Vcc) is supplied, so that the oscillation frequency of the voltage controlled oscillator is changed according to the high bandwidth and the low bandwidth.

[Operation of Voltage Controlled Oscillator]

[Operation when in High Bandwidth Oscillation]

Firstly, at the time of the high bandwidth oscillation, the band changeover switch Csw and the second variable capacitance circuit CV2 as shown in FIG. 1 are supplied with the high-level band changeover control voltage through the band-changeover control voltage terminal 6. Further, the first variable capacitance circuit CV1 and the second variable capacitance circuit CV2 are supplied with the frequency-controlling direct current voltage, through the control voltage terminal 3 for continuously varying frequency.

[Operation of Band Changeover Switch Csw]

Figure 4:
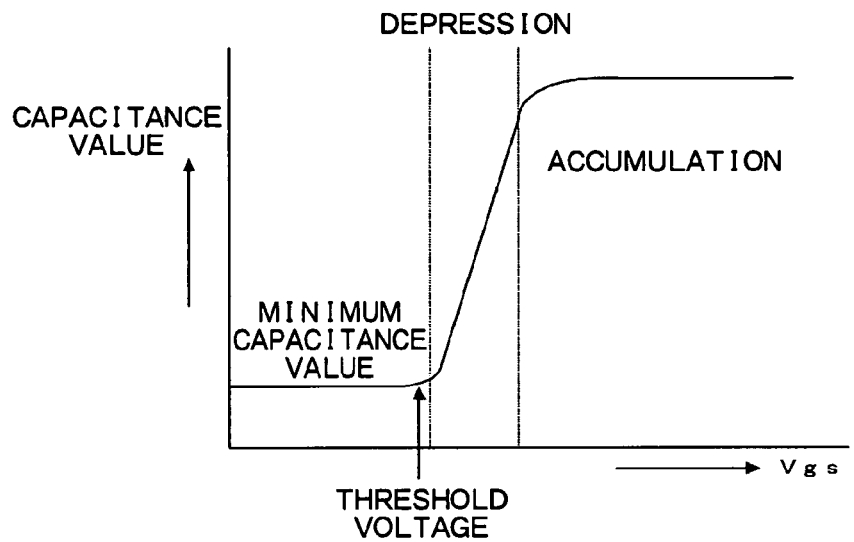
FIG. 4 is a graph for explaining a relationship between a voltage and a capacitance value between a gate and a source of a CMOS transistor provided in the voltage controlled oscillator of the present embodiment.

When the high-level band changeover control voltage is supplied, the band changeover switch Csw is transited to a state of a depression range as shown in FIG. 4, so that the CMOS capacitance shows the minimum capacitance value. Thus, the oscillation frequency of the voltage controlled oscillator, which constitutes the resonance circuit by the inductance elements L1 and L2, the first variable capacitance circuit CV1, the second variable capacitance circuit CV2, and the band changeover switch Csw as shown in FIG. 1, is set as high bandwidth.

[Operation of Second Variable Capacitance Circuit CV2 (OFF Operation of Variable Capacitance Function)]

The high-level band changeover control voltage supplied to the second variable capacitance circuit CV2 is reversed and supplied to the base of P channel FET M7 through the band-changeover control voltage terminal 6 as shown in FIG. 3. In other words, at the time of this high bandwidth oscillation, the high-level band changeover control voltage is transformed into a low-level band changeover control voltage and is supplied to the P channel FET M7.

The P channel FET M7 is turned off when the base voltage is at a low level. Gates of the CMOS transistors M1 to M6 are respectively grounded through the resistors R1 to R6 and via the resistors R7 to R9. Thus, the variable capacitance function of the second variable capacitance circuit CV2 formed by each of the CMOS transistors M1 to M6 carries out the OFF operation.

Although each of the CMOS transistors M1 to M6 is supplied with the frequency-controlling direct current voltage through the control voltage terminal 3 for continuously varying frequency, each of the CMOS transistors M1 to M6 maintains the capacitance value at the minimum value, even if the frequency-controlling direct current voltage is supplied while the variable capacitance function is carrying out the OFF operation.

In other words, for example, when the voltage controlled oscillator of the present embodiment is provided in a mobile telephone, the frequency-controlling direct current voltage supplied to each of the CMOS transistors M1 to M6 normally has a value between 0V and a power supply voltage, since the mobile telephone does not have a negative voltage supply. Therefore, in a situation where the base of each of the CMOS transistors M1 to M6 is grounded (=the variable capacitance function is in the OFF state), even if the frequency-controlling direct current voltage is supplied, a voltage (Vgs) between the gate and source of each of the CMOS transistors M1 to M6 is a negative value, which is 0V or less.

When the voltage value between the gate and source indicates a value lower than a threshold voltage (VT) as shown in FIG. 4, each of the CMOS transistors M1 to M6 maintains the capacitance value at the minimum value. Thus, even if the frequency-controlling direct current voltage is supplied in a situation where the variable capacitance function in the OFF state, the capacitance value of each of the CMOS transistors M1 to M6 is fixed to the minimum value.

[Operation of First Variable Capacitance Circuit CV1]

On the other hand, unlike the second variable capacitance circuit CV2, in the first variable capacitance circuit CV1 which does not have the off-off function of the variable capacitance function, according to the frequency-controlling direct current voltage, each of the CMOS transistors M1 to M6 is transited to the state of the depression range as shown in FIG. 4, and the capacitance value of each of the CMOS transistors M1 to M6 is continuously changed by the frequency-controlling direct current voltage. Thus, the voltage controlled oscillator oscillates at the high bandwidth oscillation frequency according to this changed capacitance value.

Specifically, let a sum of the inductance element L1 and the inductance element L2 be "L", the capacitance of the first variable capacitance circuit CV1 be "Cv1", in this case let the capacitance of the second variable capacitance circuit CV2 set to the minimum value be "Cv2min", and similarly in this case let the capacitance of the band changeover switch Csw set to the minimum value be "Cswmin", the oscillation frequency "fosc" of the voltage controlled oscillator at this time is as follows:

$$fosc=1/(2\pi \times \sqrt{L(CV1+Cv2min+Cswmin)}).$$

Here, the capacitance value of the CMOS transistor changes according to the frequency-controlling direct-current voltage value. In the case of this first variable capacitance circuit CV1, by means of the stepwise direct-current potential generation circuit 2, the direct-current bias voltages (=the first to third bias voltages V1 to V3) having the voltage values different from one another are generated and each supplied to the CMOS transistors M1 to M6.

Therefore, a voltage value (capacitance-change starting voltage value) with which the capacitance value of each of the CMOS transistors M1 to M6 starts to change differs according to the first to third voltage values of the bias voltages V1 to V3. Therefore, let the whole capacitance value at the time of connecting the CMOS transistors M1 to M6 in parallel in multiple stages be "CV", a capacitance value at the stage generated by the CMOS transistors M1 and M2 be "CV1", a capacitance value at the stage generated by the CMOS transistors M3 and M4 be "CV2", and a capacitance value at the stage generated by the CMOS transistors M5 and M6 be "CV3", $$CV=CV1+CV2+CV3$$

This expression means that the whole capacitance value of the first variable capacitance circuit CV1 is determined by summing each of the CMOS capacitances of the stages each having different capacitance-change starting voltage values. Therefore, like this first variable capacitance circuit CV1, plural pairs of CMOS transistors are connected in multiple stages, and the CMOS transistors of each stage are supplied with different bias voltages, so that the capacitance-change starting potential value is differentiated for each stage. Then, the CMOS transistors of each stage are driven by the frequency-controlling direct current voltage, so as to ease a steep change of the capacitance formed in each of the CMOS transistors M1 to M6 according to the frequency-controlling direct current voltage, and to widen the variable range of the capacitance of the first variable capacitance circuit CV1.

Further, since the different bias voltages are respectively supplied to the CMOS transistors of each stage, resistance components of the CMOS transistors also differ at each stage. Thus, let a resistance component of the stage formed by the CMOS transistors M1 and M2 be "Rp1", a resistance component of the stage formed by the CMOS transistors M3 and M4 be "Rp2", and a resistance component of the stage formed by the CMOS transistors M5 and M6 be "Rp3", the whole equivalent parallel resistance component "Rp" at the time of connecting the CMOS transistors M1 to M6 in multiple stages in parallel is:

$$Rp=Rp1+Rp2+Rp3$$

As can be seen from this expression, by respectively supplying the different bias voltages to the CMOS transistors M1 to M6 of each stage, the minimum value of the whole equivalent parallel resistance component formed by the CMOS transistors M1–M6 can be made to be a large value as compared with the case where the same bias voltage is supplied to the CMOS transistors M1 to M6. Thus, a Q value (value which shows sharpness of resonance) of the voltage controlled oscillator can be improved.

The equivalent parallel resistance component of the variable capacitance element (=the CMOS transistors M1 to M6) affects the Q value of the resonance circuit. If this Q value becomes a small value, phase noises of the oscillator increase. However, in the case of this first variable capacitance circuit CV1, since pairs of CMOS transistors are connected in multiple stages and the different bias voltages are respectively supplied to the CMOS transistors of each stage, the minimum value of the whole equivalent parallel resistance component can be offset to a large value by the different bias voltages. Thus, the Q value of the voltage controlled oscillator can be improved, the phase noises can be reduced, and the stabilized oscillation operation can be obtained.

[Operation when in Low Bandwidth Oscillation]

Next, when in the low bandwidth oscillation, the band changeover switch Csw and the second variable capacitance circuit CV2 as shown in FIG. 1 are supplied with the band changeover control voltage of the low level, through the band-changeover control voltage terminal 6. Further, the first variable capacitance circuit CV1 and the second variable capacitance circuit CV2 are supplied with the frequency-controlling direct current voltage through the control voltage terminal 3 for continuously varying frequency.

[Operation of Band Changeover Switch Csw]

When the low-level band changeover control voltage is supplied, the band changeover switch Csw is transited to a state of an accumulation range as shown in FIG. 4, so that the CMOS capacitance shows the maximum capacitance value. Thus, the oscillation frequency of the voltage controlled oscillator which constitutes the resonance circuit by the inductance elements L1 and L2, the first variable capacitance circuit CV1, the second variable capacitance circuit CV2, and the band changeover switch Csw as shown in FIG. 1, is set as the low bandwidth.

[Operation of Second Variable Capacitance Circuit CV2 (ON Operation of Variable Capacitance Function)]

The low-level band changeover control voltage supplied to the second variable capacitance circuit CV2 is reversed and supplied to the base of P channel FET M7 through the band-changeover control voltage terminal 6 as shown in FIG. 3. In other words, at the time of this low bandwidth oscillation, the low-level band changeover control voltage is transformed into the high-level band changeover control voltage, and is supplied to the P channel FET M7.

When this high-level band changeover control voltage is supplied to the base of the P channel FET M7, the P channel FET M7 carries out the ON operation, and the first to third bias voltages V1 to V3 generated in the stepwise direct-current potential generation circuit 2 are each supplied to the CMOS transistors M1 to M6 of each stage, through the resistor R7 to R9 and the resistor R1 to R6. Thus, the CMOS transistors M1-M6 of each stage are transited to the state of the depression range by the frequency-controlling direct current voltage supplied through the control voltage terminal 3 for continuously varying frequency, and the capacitance of the CMOS transistors M1 to M6 of each of the stages is continuously changed by the frequency-controlling direct current voltage.

[Operation of First Variable Capacitance Circuit CV1]

On the other hand, unlike the second variable capacitance circuit CV2, in the first variable capacitance circuit CV1 which does not have the off-off function of the variable capacitance function, according to the frequency-controlling direct current voltage, each of the CMOS transistors M1 to M6 is transited to the state of the depression range as shown in FIG. 4, and the capacitance value of each of the CMOS transistors M1 to M6 is continuously changed by the frequency-controlling direct current voltage.

Thus, the voltage controlled oscillator oscillates at the low bandwidth oscillation frequency, according to the capacitance value of the first variable capacitance circuit CV1 and the capacitance value of the second variable capacitance circuit CV2 which are changed by the frequency-controlling direct current voltage.

Specifically, let the value of the on-chip inductor formed by the inductance element L1 and the inductance element L2 be "L", the capacitance of the first variable capacitance circuit CV1 which is changed by the frequency-controlling direct current voltage be "Cv1", the capacitance of the second variable capacitance circuit CV2 which is changed by the frequency-controlling direct current voltage similarly be "Cv2", and in this case the capacitance of the band changeover switch Csw where the capacitance is set as the maximum value be "Cswmax", the oscillation frequency "fosc" of the voltage controlled oscillator at this time is as follows:

$$fosc=1/(2\pi \times \sqrt{L(Cv1+Cv2+Cswmax)}).$$

As can be seen from this expression, at the time of the low bandwidth oscillation, the voltage controlled oscillator oscillates at a frequency according to the capacitance value of the first variable capacitance circuit CV1, the capacitance value of the second variable capacitance circuit CV2, and in this case the capacitance value of the band changeover switch Csw which is set as the greatest capacitance value.

As described above, the first variable capacitance circuit CV1 and the second variable capacitance circuit CV2 form and supply the bias voltages V1 to V3 each having different voltage values in the stepwise direct-current potential generation circuit 2, to the CMOS transistors M1 to M6 of each stage, whereby both the circuits CV1 and CV2 obtain a large width change in capacitance value.

Further, the capacitance value can be further changed by adjusting a ratio of the capacitance value of the first variable capacitance circuit CV1, the capacitance value of the second variable capacitance circuit CV2, and the capacitance value of the band changeover switch Csw.

Figure 5:
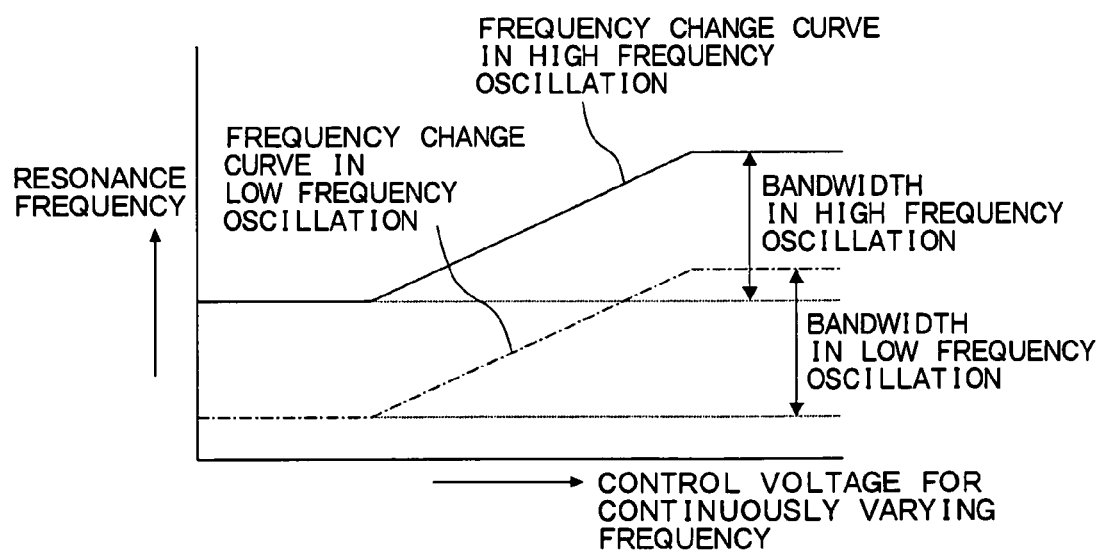
FIG. 5 is a graph showing that the voltage controlled oscillator of the present embodiment realizes wide frequency change widths at time of both high bandwidth oscillation and low bandwidth oscillation.

Therefore, since the voltage controlled oscillator of the present embodiment can obtain such a large width change in capacitance value at the time of low-voltage oscillation, it is possible to widen the change width of frequency at the time of the low bandwidth oscillation as shown in FIG. 5.

Further, since it is possible to widen the change width of frequency at the time of the low bandwidth oscillation, the frequency setting conditions at the time of the low bandwidth oscillation and the setting conditions of frequency change width can be freely set like the frequency setting conditions at the time of the high bandwidth oscillation, and the setting conditions of frequency change width.

As is clear from the above description, the voltage controlled oscillator of the present embodiment oscillates at the resonance frequency of the parallel resonance circuit constituted by the CMOS transistors T1 to T4 for generating the negative resistance component, the inductance elements L1 and L2 which are connected in series, the first variable capacitance circuit CV1, the second variable capacitance circuit CV2 having the on-off function for the variable capacitance function, and the band changeover switch Csw for switching the oscillation frequencies according to the high bandwidth and the low bandwidth.

Figure 6:
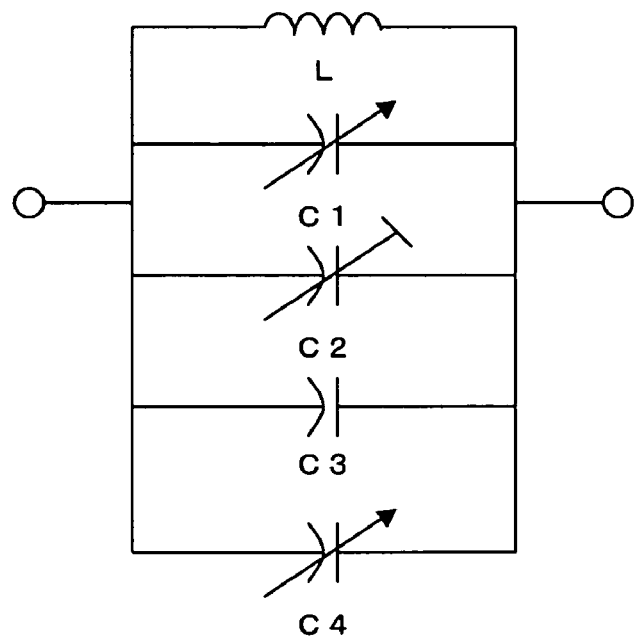
FIG. 6 is a diagram for explaining oscillation conditions of the voltage controlled oscillator of the present embodiment.

Specifically, the equivalent circuit of the voltage controlled oscillator of the present embodiment is shown in FIG. 6. As can be seen from FIG. 6, let the value of the on-chip inductor formed by the inductance elements L1 and L2 be "L", the variable capacitance value of the first variable capacitance circuit CV1 be "C1", the variable capacitance value of the second variable capacitance circuit CV2 be "C2", the sum of the wiring capacitance in the chip of the voltage controlled oscillator and the gate capacitance of the oscillating circuit transistor be "C3", the variable capacitance value of the second variable capacitance circuit CV2 be "C4", and the oscillation frequency of the voltage controlled oscillator be "fosc", it oscillates on the conditions of:

$$fosc=1/(2\pi \times \sqrt{L(C1+C2+C3+C4)}).$$

Since the second variable capacitance circuit CV2 has the on-off switch (=the P channel FET M7: FIG. 3) for the variable capacitance function, such a voltage controlled oscillator can control and turn off the variable capacitance function of the second variable capacitance circuit CV2 by means of this P channel FET M7 at the time of the high bandwidth oscillation, and perform the high bandwidth oscillation based on a capacitance change of the first variable capacitance circuit CV1.

Further, at the time of the high bandwidth oscillation, the first to third bias voltage V1–V3 supplied from the stepwise direct-current potential generation circuit 2 to the CMOS variable capacitance circuit 1 of the second variable capacitance circuit CV2 are grounded, so that the capacitance value of the CMOS, variable capacitance circuit 1 is arranged to be maintained at the minimum value. Thus, it is possible to omit a circuit for supplying the constant voltage so that the capacitance value of the second variable capacitance circuit CV2 is maintained constant, which is one variable capacitance circuit that is not used at the time of the high bandwidth oscillation.

Figure 7:
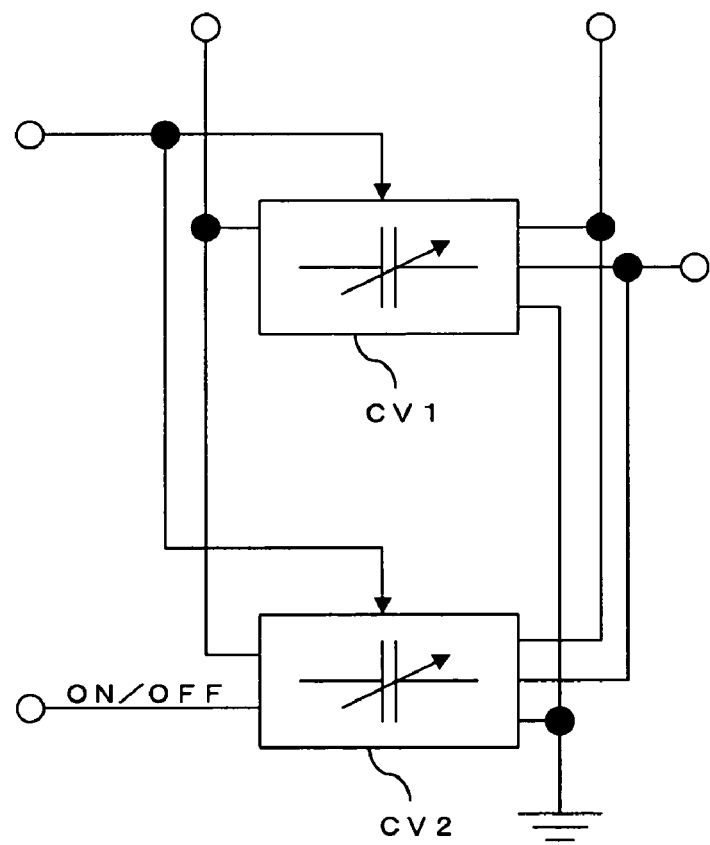
FIG. 7 is a diagram showing a simplified circuit structure realized by the voltage controlled oscillator of the present embodiment.
Figure 8:
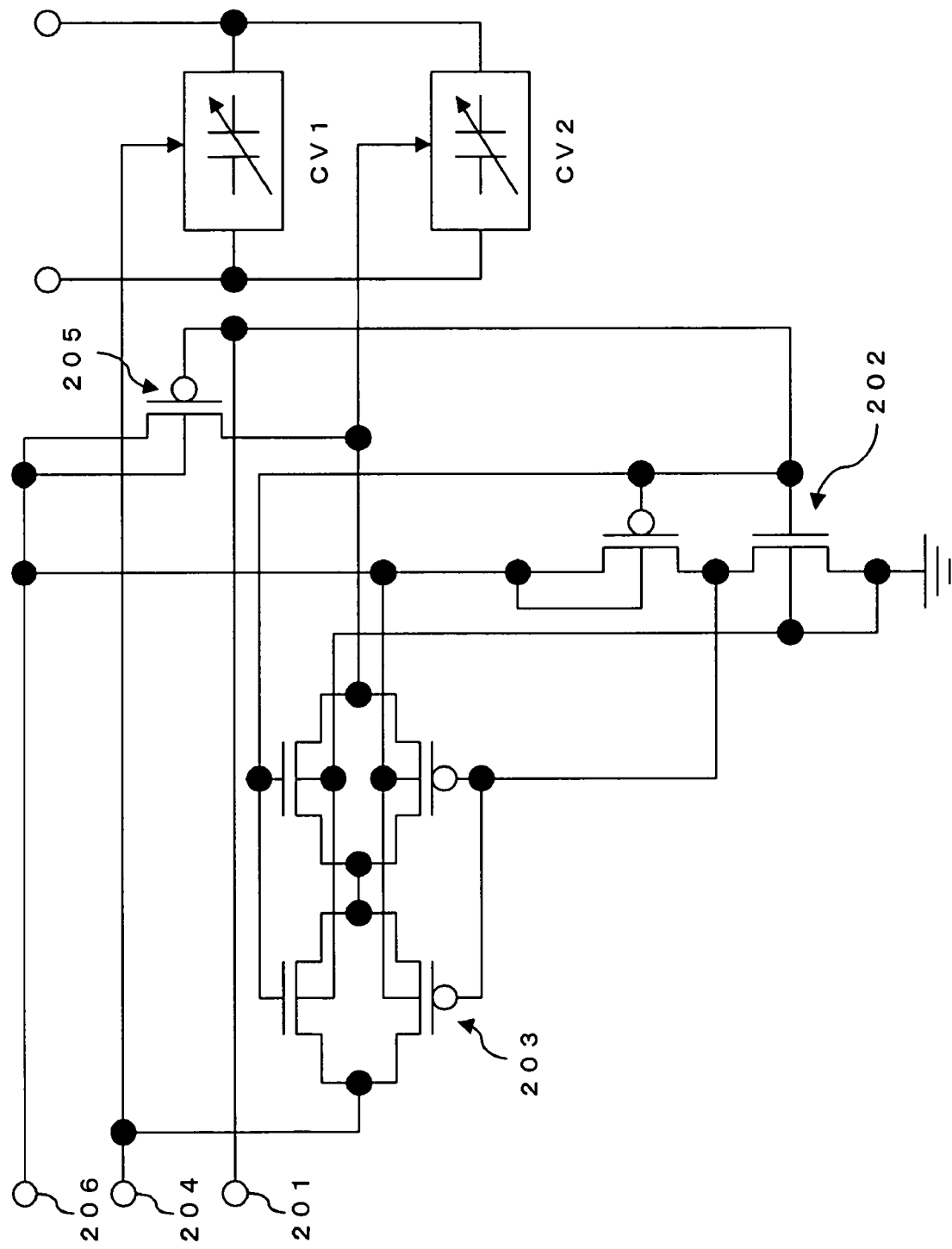
FIG. 8 is a circuit diagram showing a related art voltage controlled oscillator.
Figure 9:
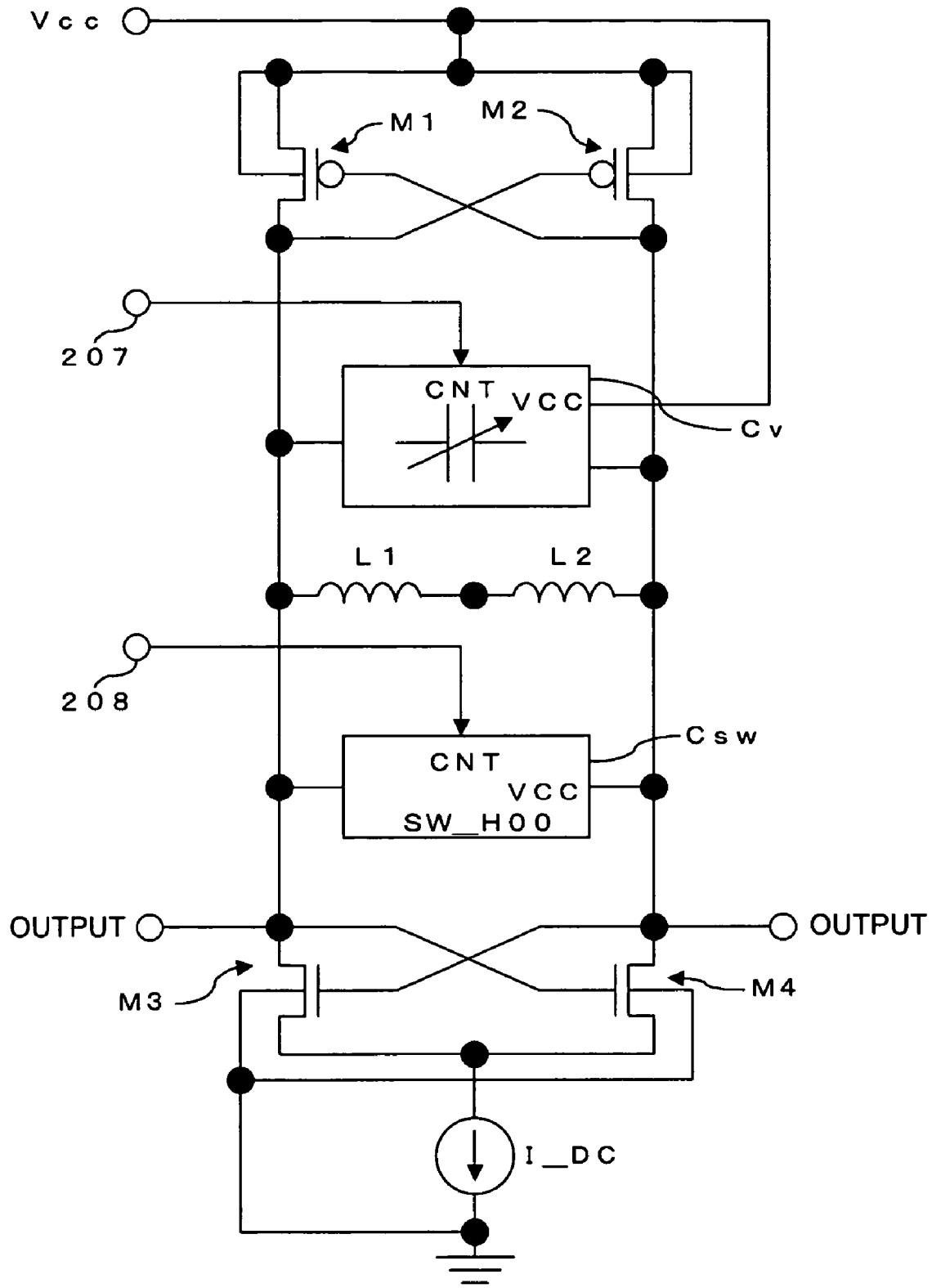
FIG. 9 is a circuit diagram showing another related art voltage controlled oscillator.

FIG. 7 is a diagram conceptually showing the voltage controlled oscillator of the present embodiment. As can be seen from a comparison of FIG. 7 and FIG. 8 showing the conventional voltage controlled oscillator, the analog switch 203 and the constant voltage supply switch 205 which are conventionally necessary can be omitted by providing the second variable capacitance circuit CV2 which has the on-off switch for the variable capacitance function. Therefore, the voltage controlled oscillator of the present embodiment can simplify the whole circuit structure by providing the second variable capacitance circuit CV2. Further, since the whole circuit structure can be simplified, the wiring layout at the time of forming the voltage controlled oscillator into one chip can be easily achieved.

Further, the first variable capacitance circuit CV1 and the second variable capacitance circuit CV2 form and supply the bias voltages V1 to V3 each having different voltage values in the stepwise direct-current potential generation circuit 2, to the CMOS transistors M1 to M6 of each stage, whereby both the circuits CV1 and CV2 obtain the large width change in capacitance value.

Furthermore, the capacitance value can be further changed by adjusting the ratio of the capacitance value of the first variable capacitance circuit CV1, the capacitance value of the second variable capacitance circuit CV2, and the capacitance value of the band changeover switch Csw.

Therefore, since the voltage controlled oscillator of the present embodiment can obtain such a large width change in capacitance value at the time of low-voltage oscillation, it is possible to widen the change width of frequency at the time of the low bandwidth oscillation.

Further, since it is possible to widen the change width of frequency at the time of the low bandwidth oscillation, the frequency setting conditions at the time of the low bandwidth oscillation and the setting conditions of frequency change width can be freely set like the frequency setting conditions at the time of the high bandwidth oscillation, and the setting conditions of frequency change width.

[MODIFICATION]

In addition, in the above description of the present embodiments, as for the first and second variable capacitance circuits CV1 and CV2, the CMOS transistors to be pairs are connected in three stages in parallel. However, if the CMOS transistors to be pairs are arranged in any number of stages, such as four stages or five stages, for example, it is possible to acquire the same effect as described above. In this case, a voltage dividing resistor for the stepwise direct-current potential generation circuit 2 may only be added to provide the bias voltages for the number of stages of the CMOS transistors of the variable capacitance circuit.

In addition, the present invention is not limited to the above-mentioned embodiments which are disclosed by way of example, an embodiment other than the above present embodiments can of course provide various modifications according to a design etc., as far as it is within the range of the technical ideas in accordance with the present invention.

What is claimed is:

1. A variable capacitance circuit comprising:
   variable capacitance means, formed such that variable capacitance elements whose capacitance values change according to a voltage value of a supplied capacitance control voltage are connected so as to be paired and a plurality pairs of variable capacitance elements are connected in parallel forming multiple stages;

a bias voltage generation means for generating bias voltages of different voltage values based on a constant voltage from a constant voltage source; and an on-off switch for a variable capacitance function, in which if the variable capacitance function of the variable capacitance means is turned on, the variable capacitance function of the variable capacitance means is turned on by supplying the bias voltage of each voltage value generated by the bias voltage generation means to the variable capacitance element of each stage of the variable capacitance means, and if the variable capacitance function of the variable capacitance means is turned off, the variable capacitance function of the variable capacitance means is turned off by grounding the bias voltage of each voltage value generated by the bias voltage generation means, the bias voltage each being supplied to the variable capacitance element of each stage of the variable capacitance means, wherein the bias voltage generation means generates a plurality of bias voltages of different voltage values by dividing the constant voltage of the constant voltage source by using a plurality of resistors, and wherein the variable capacitance means is formed such that a drain and a source of each of CMOS transistors, which are the variable capacitance elements, are connected, a connection point between the drain and the source of each of the CMOS transistors are commonly connected to a terminal to which the capacitance control voltage is supplied, and bases of each of the CMOS transistors are connected to the bias voltage generation means so as to be supplied the bias voltage of any one of the voltage values.

2. A variable capacitance circuit comprising:

variable capacitance means, formed such that variable capacitance elements whose capacitance values change according to a voltage value of a supplied capacitance control voltage are connected so as to be paired and a plurality pairs of variable capacitance elements are connected in parallel forming multiple stages;

a bias voltage generation means for generating bias voltages of different voltage values based on a constant voltage from a constant voltage source; and an on-off switch for a variable capacitance function, in which if the variable capacitance function of the variable capacitance means is turned on, the variable capacitance function of the variable capacitance means is turned on by supplying the bias voltage of each voltage value generated by the bias voltage generation means to the variable capacitance element of each stage of the variable capacitance means, and if the variable capacitance function of the variable capacitance means is turned off, the variable capacitance function of the variable capacitance means is turned off by grounding the bias voltage of each voltage value generated by the bias voltage generation means, the bias voltage each being supplied to the variable capacitance element of each stage of the variable capacitance means, wherein the bias voltage generation means generates a plurality of bias voltages of different voltage values by dividing the constant voltage of the constant voltage source by using a plurality of resistors, wherein the variable capacitance means is formed such that a drain and a source of each of CMOS transistors, which are the variable capacitance elements, are connected, a connection point between the drain and the source of each of the CMOS transistors are commonly connected to a terminal to which the capacitance control voltage is supplied, and bases of each of the CMOS transistors are connected to the bias voltage generation means so as to be supplied the bias voltage of any one of the voltage values, and said variable capacitance circuit further comprises, a first bias voltage supplied terminal to which the bases of one of the pair CMOS transistors are commonly connected and a bias voltage of a circuit where the variable capacitance circuit is disposed is supplied;

a second bias voltage supplied terminal to which the bases of the other of the pair CMOS transistors are commonly connected and the bias voltage of the circuit where the variable capacitance circuit is disposed is supplied; and capacitance elements, disposed between the bases of one of the pair CMOS transistors and the first bias voltage supplied terminal and between the bases of the other of the pair CMOS transistors and the second bias voltage supplied terminal, for cutting the bias voltage of the circuit where the variable capacitance circuit is disposed to be supplied to the bases of each of the CMOS transistors via each of the bias voltage supplied terminals.

3. A voltage controlled oscillator configured by connecting a resonance circuit having an inductance element, variable capacitance means connected to the inductance element in parallel, and band changeover means for switching oscillation frequency bands, to a negative resistance circuit of a differential structure, comprising:

a first variable capacitance means having,
   a first variable capacitance circuit, provided as the variable capacitance means of the resonance circuit and formed such that variable capacitance elements whose capacitance values change according to a voltage value of a supplied capacitance control voltage are connected so as to be paired and a plurality of pairs of the variable capacitance elements are connected in parallel forming multiple stages, and
   a first bias voltage generation circuit configured to generate bias voltages of different voltage values to supply to each variable capacitance element of the first variable capacitance circuit based on a constant voltage from a constant voltage source;

a second variable capacitance means having,
   a second variable capacitance circuit, provided as variable capacitance means of the resonance circuit and formed such that variable capacitance elements whose capacitance values change according to the voltage value of the supplied capacitance control voltage are connected so as to be paired and a plurality of pairs of the variable capacitance elements are connected in parallel forming multiple stages,
   a second bias voltage generation circuit configured to generate bias voltages of different voltage values based on the constant voltage from the constant voltage source, and
   an on-off switch for a variable capacitance function, in which if the variable capacitance function of the second variable capacitance circuit is turned on, the variable capacitance function of the second variable capacitance circuit is turned on by supplying the bias voltage of each voltage value generated by the second bias voltage generation circuit to the variable capacitance element of each stage of the second variable capacitance circuit, and if the variable capacitance function of the second variable capacitance circuit is turned off, the second variable capacitance function of the second variable capacitance circuit is turned off by grounding the bias voltage of each voltage value generated by the second bias voltage generation circuit, the bias voltage each being supplied to the variable capacitance element of each stage of the second variable capacitance circuit; and a band changeover switch, provided as the band change means, in which if the variable capacitance function of the second variable capacitance circuit is turned off, the oscillation frequency band is set as a high bandwidth by controlling the capacitance value to be a minimum value, and if the variable capacitance function of the second variable capacitance circuit is turned on, the oscillation frequency band is set as a low bandwidth by controlling the capacitance value to be a maximum value, wherein the first bias voltage generation circuit and the second bias generation circuit generate a plurality of bias voltages of different voltage values by dividing the constant voltage of the constant voltage source by using a plurality of resistors, and wherein the first variable capacitance circuit and the second variable capacitance circuit are formed such that a drain and a source of each of CMOS transistors, which are the variable capacitance elements, are connected, a connection point between the drain and the source of each of the CMOS transistors are commonly connected to a terminal to which the capacitance control voltage is supplied, and bases of each of the CMOS transistors are connected to the first bias voltage generation circuit or the second bias voltage circuit so as to be supplied the bias voltage of any one of the voltage values.

4. A voltage controlled oscillator configured by connecting a resonance circuit having an inductance element, variable capacitance means connected to the inductance element in parallel, and band changeover means for switching oscillation frequency bands, to a negative resistance circuit of a differential structure, comprising:

a first variable capacitance means having,
   a first variable capacitance circuit, provided as the variable capacitance means of the resonance circuit and formed such that variable capacitance elements whose capacitance values change according to a voltage value of a supplied capacitance control voltage are connected so as to be paired and a plurality of pairs of the variable capacitance elements are connected in parallel forming multiple stages, and
   a first bias voltage generation circuit configured to generate bias voltages of different voltage values to supply to each variable capacitance element of the first variable capacitance circuit based on a constant voltage from a constant voltage source;

a second variable capacitance means having,
   a second variable capacitance circuit, provided as variable capacitance means of the resonance circuit and formed such that variable capacitance elements whose capacitance values change according to the voltage value of the supplied capacitance control voltage are connected so as to be paired and a plurality of pairs of the variable capacitance elements are connected in parallel forming multiple stages,
   a second bias voltage generation circuit configured to generate bias voltages of different voltage values based on the constant voltage from the constant voltage source, and an on-off switch for a variable capacitance function, in which if the variable capacitance function of the second variable capacitance circuit is turned on, the variable capacitance function of the second variable capacitance circuit is turned on by supplying the bias voltage of each voltage value generated by the second bias voltage generation circuit to the variable capacitance element of each stage of the second variable capacitance circuit, and if the variable capacitance function of the second variable capacitance circuit is turned off, the variable capacitance function of the second variable capacitance circuit is turned off by grounding the bias voltage of each voltage value generated by the second bias voltage generation circuit, the bias voltage each being supplied to the variable capacitance element of each stage of the second variable capacitance circuit; and a band changeover switch, provided as the band change means, in which if the variable capacitance function of the second variable capacitance circuit is turned off, the oscillation frequency band is set as a high bandwidth by controlling the capacitance value to be a minimum value, and if the variable capacitance function of the second variable capacitance circuit is turned on, the oscillation frequency band is set as a low bandwidth by controlling the capacitance value to be a maximum value, wherein the first bias voltage generation circuit and the second bias generation circuit generate a plurality of bias voltages of different voltage values by dividing the constant voltage of the constant voltage source by using a plurality of resistors, wherein the first variable capacitance circuit and the second variable capacitance circuit are formed such that a drain and a source of each of CMOS transistors, which are the variable capacitance elements, are connected, a connection point between the drain and the source of each of the CMOS transistors are commonly connected to a terminal to which the capacitance control voltage is supplied, and bases of each of the CMOS transistors are connected to the first bias voltage generation circuit or the second bias voltage circuit so as to be supplied the bias voltage of any one of the voltage values, and wherein the first variable capacitance circuit and the second variable capacitance circuit further comprises:

a first bias voltage supplied terminal to which the bases of one of the pair CMOS transistors are commonly connected and the bias voltage of the voltage controlled oscillator is supplied;

a second bias voltage supplied terminal to which the bases of the other of the pair CMOS transistors are commonly connected and the bias voltage of the voltage controlled oscillator is supplied; and capacitance elements, disposed between the bases of one of the pair CMOS transistors and the first bias voltage supplied terminal and between the bases of the other of the pair CMOS transistors and the second bias voltage supplied terminal, and configured to cut the bias voltage of the voltage controlled oscillator to be supplied to the bases of each of the CMOS transistors via each of the bias voltage supplied terminals.

* * * * *